United States Patent [19]

Sato et al.

[11] Patent Number: 5,751,026
[45] Date of Patent: May 12, 1998

[54] EPITAXIAL WAFER OF GALLIUM ARSENIDE PHOSPHIDE

[75] Inventors: Tadashige Sato; Megumi Imai; Tsuneteru Takahashi, all of Ushiku, Japan

[73] Assignee: Mitsubishi Kasei Corporation, Tokyo, Japan

[21] Appl. No.: 801,295

[22] Filed: Feb. 18, 1997

Related U.S. Application Data

[63] Continuation of Ser. No. 573,885, Dec. 18, 1995, abandoned, which is a continuation of Ser. No. 97,237, Jul. 27, 1993, abandoned.

Foreign Application Priority Data

Jul. 28, 1992 [JP] Japan .................... 4-201368

[51] Int. Cl.$^6$ .................... H01L 33/00
[52] U.S. Cl. .................... 257/190; 257/87
[58] Field of Search .................... 257/190, 87, 191

[56] References Cited

U.S. PATENT DOCUMENTS

| | | | |
|---|---|---|---|
| Re. 29,845 | 11/1978 | Groves et al. | 257/87 |
| 3,942,185 | 3/1976 | Lebailly | 257/87 |
| 3,963,538 | 6/1976 | Broadie et al. | 257/90 |
| 4,218,270 | 8/1980 | Hasegawa et al. | |
| 4,252,576 | 2/1981 | Hasegawa et al. | 257/87 |
| 4,558,336 | 12/1985 | Chang et al. | 257/190 |
| 4,865,655 | 9/1989 | Fujita et al. | 257/88 |

FOREIGN PATENT DOCUMENTS 1-286372  11/1989  Japan .

Primary Examiner—Jerome Jackson
Assistant Examiner—John Guay
Attorney, Agent, or Firm—Armstrong, Westerman, Hattori, McLeland & Naughton

[57] ABSTRACT

In an epitaxial wafer of gallium arsenide phosphide, a single crystal substrate is provided thereon with a gallium arsenide phosphide layer with a varying mixed crystal ratio, a gallium arsenide phosphide layer with a constant mixed crystal ratio, and a nitrogen-doped gallium arsenide phosphide layer with a constant mixed crystal ratio. The nitrogen-doped gallium arsenide phosphide layer with a constant mixed crystal ratio has a carrier concentration of $3\times10^{15}$ cm$^{-3}$ or less.

5 Claims, 3 Drawing Sheets

1

EPITAXIAL WAFER OF GALLIUM ARSENIDE PHOSPHIDE

This application is a continuation of application Ser. No. 08/573,885 filed Dec. 18, 1995, now abandoned, which is a continuation of application Ser. No. 08/097,237, filed Jul. 27, 1993 now abandoned.

BACKGROUND OF THE INVENTION

The present invention relates to an epitaxial wafer of gallium arsenide phosphide that lends itself well fit for the fabrication of light emitting diodes (LEDs) having an increased service life, and a method of wafer preparation.

LEDs made up of epitaxial wafers of gallium arsenide phosphide mixed crystals emit light of the so-called neutral tints such as yellow and orange, and so find wide application in various types of display devices.

LEDs, when used on display equipment, are required to have high and average luminance. LEDs are also required not to undergo any luminance drop during use or, in another parlance, to have an increased service life.

So far, means for decreasing the carrier concentration of an epitaxial wafer or other means have been taken so as to increase the service life of an LED.

However, a problem with a conventional LED is that when used under severe conditions such as those encountered outdoors, its service life is so decreased that discoloration or color shading takes place on a display panel made up of that LED.

To solve this problem, it is required not only to improve the step of preparing chips for an LED but also to make epitaxial wafer quality better.

In addition, another problem with the conventional LED is that when it is intended to extend its service life by lowering the carrier concentration, there is a rise in its forward rise voltage (Vf).

An object of the invention is therefore to provide a solution to the problems mentioned above.

SUMMARY OF THE INVENTION

According to the invention, this object is achieved by the provision of an epitaxial wafer of gallium arsenide phosphide in which a single crystal substrate is provided thereon with a gallium arsenide phosphide layer with a varying mixed crystal ratio, a gallium arsenide phosphide layer with a constant mixed crystal ratio, and a nitrogen-doped gallium arsenide phosphide layer with a constant mixed crystal ratio, said nitrogen-doped gallium arsenide phosphide layer with a constant mixed crystal ratio having a carrier concentration of $3 \times 10^{15}$ cm$^{-3}$ or less.

BRIEF DESCRIPTION OF THE DRAWINGS

A gallium arsenide phosphide epitaxial wafer in accordance with the invention will now be explained, by way of example only, with reference to the accompanying drawings, in which.

DETAILED DESCRIPTION OF THE INVENTION

In the present disclosure, the "gallium arsenide phosphide mixed crystal" refers to that represented by GaAs$_{1-x}$P$_x$ where $1 > x \geq 0.5$, and the "mixed crystal ratio" refers to the value of "x". The mixed crystal ratio in this range lies in an indirect transition region, and so the external quantum efficiency can be increased by doping with nitrogen that is an isoelectronic trap.

Figure 1:
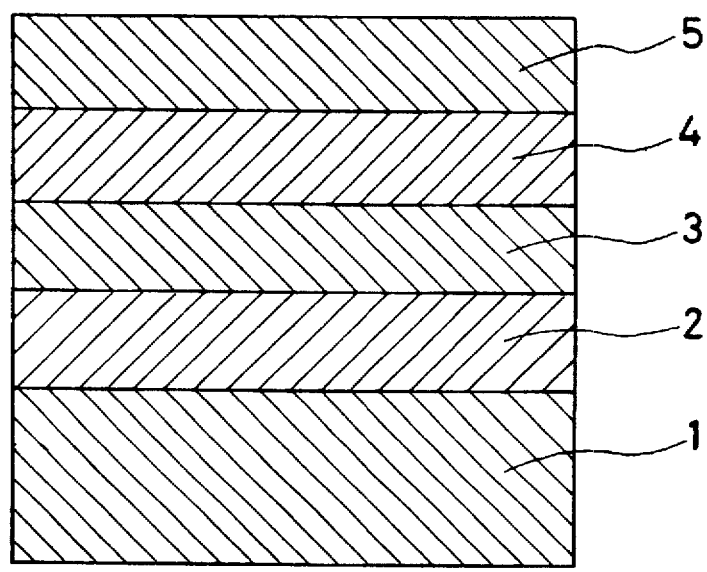
FIG. 1 is a longitudinally sectioned schematic showing one example of the wafer according to the invention.

Referring now to FIG. 1, there is schematically shown a section of the wafer according to the invention.

In FIG. 1, reference numeral 1 stands for a single crystal substrate, for which a gallium phosphide single crystal substrate is usually used. The available crystallographic plane of the substrate 1 is usually the {100} plane, or may be at an angle of a few degrees or smaller with respect to the {100} plane in the <100> direction.

For the conduction type of the substrate, usually, an n-type is chosen. As the n-type dopant, tellurium, sulfur, selenium, or the like are used. Usually, the carrier concentration lies in the range of about $1 \times 10^{17}$ to about $5 \times 10^{18}$ cm$^{-3}$.

Reference numeral 2 stands for a gallium phosphide epitaxial layer, which is provided as a sort of buffer so as to prevent whether the crystallizability of the substrate 1 is good or bad from having any influence on the crystallizability of a gallium arsenide phosphide epitaxial layer. If required, this layer may be dispensed with.

Reference numeral 3 represents a gallium arsenide phosphide layer with a varying mixed crystal ratio, which is provided for the purpose of relieving strain due to a lattice constant difference between gallium phosphide and the gallium arsenide phosphide layer formed on the layer 3.

The mixed crystal ratio of the layer 3 varies continuously from 1 to the mixed crystal ratio of the gallium arsenide phsophide layer with a constant mixed crystal ratio.

Reference numeral 4 indicates a gallium arsenide phosphide layer with a constant mixed crystal ratio. The mixed crystal ratio of the layer 4 is selected depending on a desired emission wavelength, for instance, yellow at about 0.9 and orange at about 0.6.

Reference numeral 5 is a nitrogen-doped gallium arsenide phosphide layer with a constant mixed crystal ratio. Nitrogen is in this case doped on that layer as isoelectronic impurities. Gallium arsenide phosphide having a mixed crystal ratio larger than 0.5, because of an indirect transition type, fails to give rise to any increase in emission efficiency, unless nitrogen is doped on it.

Usually, the layers 4 and 5 have the same mixed crystal ratio.

The carrier concentration of the layer 5 is selected from the range of $3 \times 10^{15}$ cm$^{-3}$ or less, preferably $1 \times 10^{15}$ cm$^{-3}$ to $3 \times 10^{15}$ cm$^{-3}$ inclusive.

It is not preferable that the carrier concentration of the layer 5 exceeds $3 \times 10^{15}$ cm$^{-3}$, because the service life of the resultant LED cannot be well increased. At less than $1 \times 10^{15}$ cm$^{-3}$, it is difficult to fabricate epitaxial wafers on an industrial scale.

Usually, the carrier concentrations of the layers 2 to 4 should preferably lie in the range of $5 \times 10^{16}$ cm$^{-3}$ to $5 \times 10^{17}$ cm$^{-3}$. The reason the above range is preferable is that at too high carrier concentrations, there will be a drop of crystallizability, whereas at too low carrier concentrations the specific resistance of the resultant epitaxial wafer will be increased.

While no critical limitation is imposed on how to prepare the epitaxial wafers according to the invention, they are usually prepared by vapor phase epitaxial growth processes. Vapor phase epitaxial growth is preferably carried out by halide and hydride pumping processes.

Referring to the growth of the layer 5, it is possible to obtain the nitrogen-doped gallium arsenide phosphide layer 5 with a constant mixed crystal ratio, which has a carrier concentration of $3\times10^{15}$ cm$^{-3}$ or less, by growing the layers 2 to 4 with the carrier concentrations lying in the range of $5\times10^{16}$ cm$^{-3}$ to $5\times10^{17}$ cm$^{-3}$ and, then, stopping the feed of dopant alone, followed by the introduction of ammonia.

EXAMPLES

The invention will now be explained, more specifically but not exclusively, with reference to some examples.

A sulfur-doped gallium phosphide single crystal substrate having a carrier concentration of $2.5\times10^{17}$ cm$^{-3}$ was used. The crystallographic plane of the substrate used was at an angle of 6 degrees with respect to the (100) plane in the <110> direction. For epitaxial growth, the so-called hydride pumping process was used with an epitaxial growth gas composition of $AsH_3$—$PH_3$—$HCl$—$Ga$—$H_2$.

Diethyl tellurium was used as the n-type dopant, and ammonia was employed as a nitrogen source.

A gallium arsenide phosphide epitaxial wafer (with a mixed crystal ratio of 0.9) for yellow LEDs was grown, using a quartz-made horizontal reactor.

The system was placed under control such that the carrier concentrations of the layers 2 to 4 were in the range of 1 to $5\times10^{17}$ cm$^{-3}$, and the feed of the dopant was stopped for the growth of the layer 5.

Gallium arsenide phosphide epitaxial wafers with the carrier concentrations of the layers 5 being in the range of $1\times10^{15}$ cm$^{-3}$ to $6\times10^{16}$ cm$^{-3}$ were grown in this manner.

These epitaxial wafers were then used to prepare LEDs, which were in turn estimated in terms of luminance and service life.

Life was estimated on the basis of luminance changes (which will be defined later).

For this purpose, three types of wafers were made at each carrier concentration. Each wafer was used to prepare three LED chips. These chips were sampled at random to measure luminance changes under the following conditions.

Each LED sample with a known initial luminance was measured in terms of a luminance change after 168 hours at 240 A/cm$^2$, a pulse-recurrence frequency of 100 Hz and a duty 1/2 in the absence of a resin mold.
Luminance Change=Luminance After 168 hr÷Initial Luminance×100

When the carrier concentration of the layer 5 was 1.8× $10^{15}$ cm$^{-3}$, Vf remained unchanged at 2.06 V.

Figure 2:
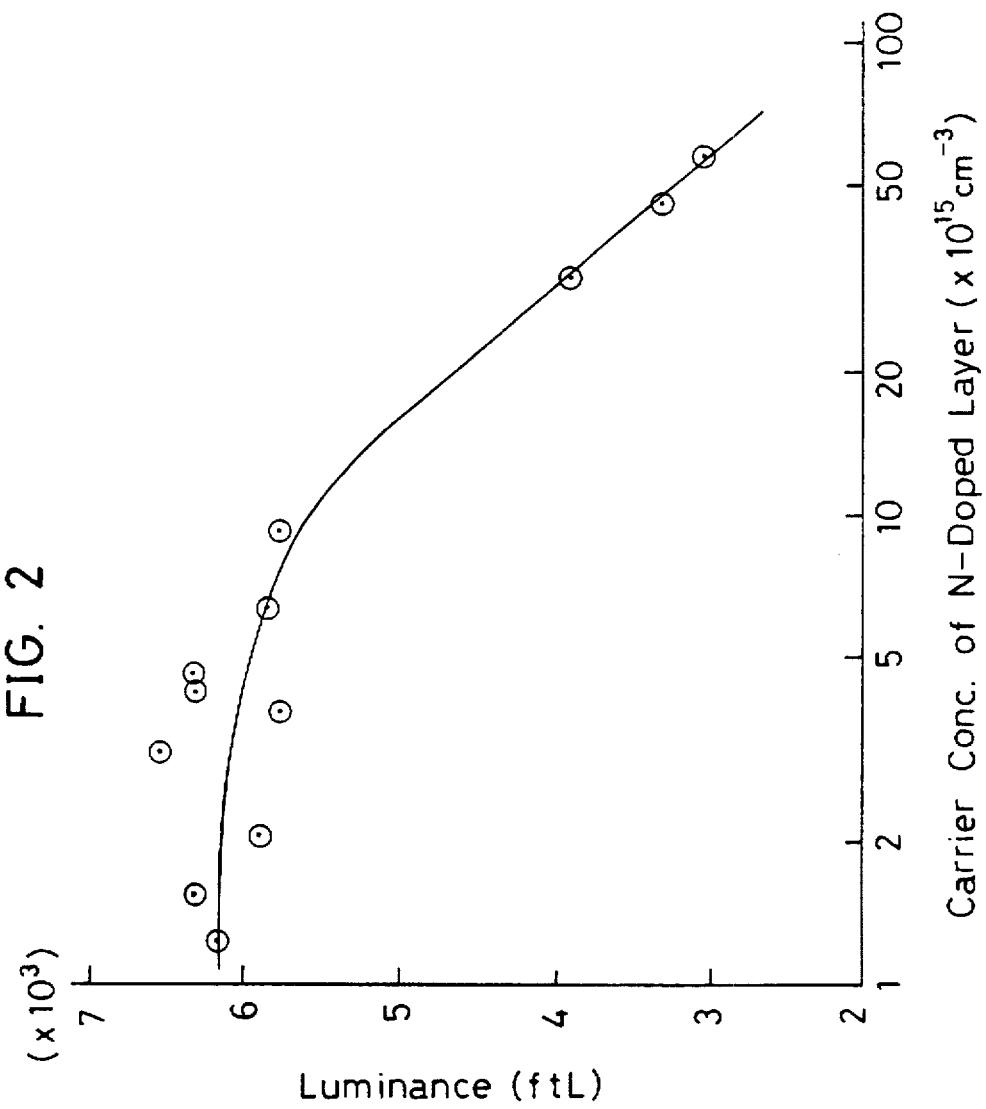
FIG. 2 is a schematic illustration of the relation between luminance and carrier concentration.
Figure 3:
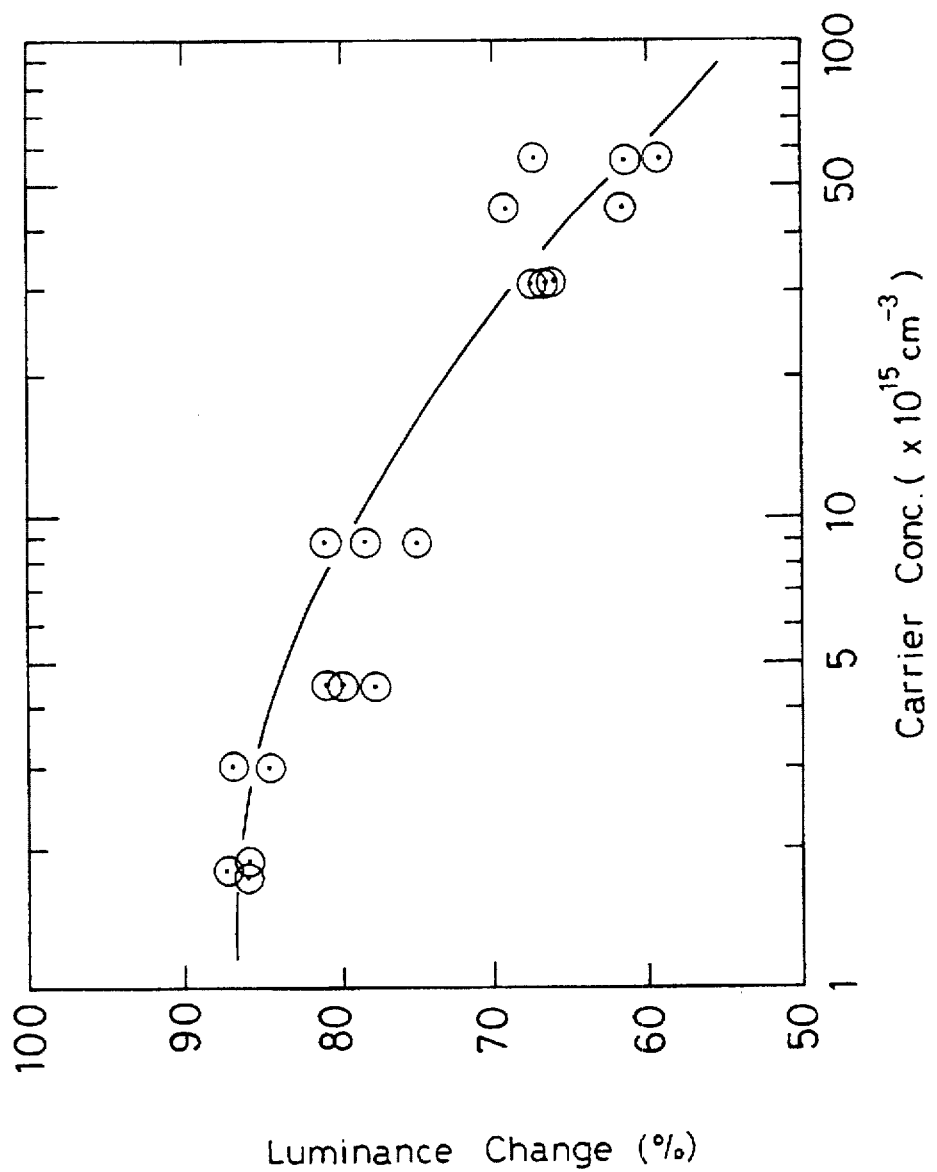
FIG. 3 is a schematic illustration of the relation between luminance change and carrier concentration.

The results are set out in Table 1 and plotted in FIGS. 2 and 3.

TABLE 1

| Carrier Conc. × $10^{15}$ cm$^{-3}$ | Luminance Change After 168 hr, % |
| --- | --- |
| 1.8 | 87.4 |
| 1.8 | 85.8 |
| 1.8 | 85.8 |
| 3.0 | 86.9 |
| 3.0 | 84.4 |
| 4.5 | 77.5 |
| 4.5 | 79.7 |

TABLE 1-continued

| Carrier Conc. × $10^{15}$ cm$^{-3}$ | Luminance Change After 168 hr, % |
| --- | --- |
| 8.9 | 78.9 |
| 8.9 | 74.9 |
| 31 | 67.5 |
| 31 | 66.8 |
| 31 | 66.2 |
| 45 | 69.4 |
| 45 | 62.6 |
| 57 | 67.4 |
| 57 | 62.3 |
| 57 | 59.5 |

FIG. 2 represents the relation between carrier concentration and luminance, with luminance (ftL) as ordinate and the carrier concentration of layer 5 as abscissa.

In Table 1 the relation between the carrier concentration of layer 5 and the service life of LEDs or luminance changes after the lapse of 168 hours is shown.

The data shown in Table 1 are plotted in FIG. 3 with the life of LEDs or luminance changes after 168 hours as ordinate and the carrier concentration of layer 5 as abscissa.

The luminance after 168 hours of LEDs obtained from the wafers of the invention were 80% or more of the initial value.

LEDs obtained from the wafers of the invention undergo little or no luminance drop during use and have small vf, and so are of great commercial value.

What is claimed is:

1. An epitaxial wafer of gallium arsenide phosphide comprising a single crystal substrate, having a gallium arsenide phosphide layer with a varying mixed crystal ratio, a gallium arsenide phosphide layer with a constant mixed crystal ratio and a nitrogen-doped gallium arsenide phosphide layer with a constant mixed crystal ratio provided thereon, wherein a carrier concentration of said gallium arsenide phosphide with a varying mixed crystal layer and said gallium arsenide phosphide with a constant mixed crystal ratio lies in the range of $5\times10^{16}$ cm$^{-3}$ to $5\times10^{7}$ cm$^{-3}$, and said nitrogen-doped gallium arsenide phosphide layer with a constant mixed crystal ratio having a carrier concentration of $3\times10^{15}$ cm$^{-3}$ or less.

2. A wafer according to claim 1, wherein a mixed crystal ratio x is within the range of 0.5<x<1 when said nitrogen-doped gallium arsenide phosphide with a constant mixed crystal ratio is $GaAs_{1-x}P_x$.

3. A wafer according to claim 1, wherein a mixed crystal ratio x0 is within the range of 0.45<x0<1 when said nitrogen-doped gallium arsenide phosphide with a constant mixed crystal ratio is $GaAs_{1-x0}P_{x0}$.

4. A wafer according to claims 1, 2 or 3, wherein said single crystal substrate is a gallium phosphide single crystal substrate.

5. A wafer according to claim 1, wherein the carrier concentration is within the range of $1\times10^{17}$ cm$^{-3}$ to $5\times10^{17}$ cm$^{-3}$.

* * * * *

UNITED STATES PATENT AND TRADEMARK OFFICE
CERTIFICATE OF CORRECTION

PATENT NO.: 5,751,026
DATED : May 12, 1998
INVENTOR(S): SATO et al.

It is certified that an error appears in the above-identified patent and that said Letters Patent is hereby corrected as shown below:

In column 4, on line 43 "$5 \times 10^7$" should be --$5 \times 10^{17}$--.

Signed and Sealed this

Eighteenth Day of May, 1999

Attest:

Attesting Officer

Q. TODD DICKINSON

Acting Commissioner of Patents and Trademarks